United States Patent [19]

Iwamoto et al.

[11] Patent Number: 5,819,307
[45] Date of Patent: Oct. 6, 1998

[54] CONTROL METHOD IN WHICH FREQUENCY OF DATA ERASURES IS LIMITED

[75] Inventors: Norishige Iwamoto; Hideomi Watanabe; Ken Ryu; Yasumori Hibi, all of Tokyo, Japan

[73] Assignee: Fujitsu Limited, Kanagawa, Japan

[21] Appl. No.: 431,315

[22] Filed: Apr. 28, 1995

[30] Foreign Application Priority Data

Oct. 20, 1994 [JP] Japan .................................. 6-255809

[51] Int. Cl.⁶ ..................................................... G06F 12/00
[52] U.S. Cl. ......................................... 711/103; 365/185.33
[58] Field of Search .............................. 365/218, 185.33; 395/430; 711/103

[56] References Cited

U.S. PATENT DOCUMENTS

| | | | |
|---|---|---|---|
| 5,341,339 | 8/1994 | Wells | 365/218 |
| 5,388,083 | 2/1995 | Assar et al. | 365/218 |
| 5,544,356 | 8/1996 | Robinson et al. | 395/600 |
| 5,568,423 | 10/1996 | Jou et al. | 365/185.33 |
| 5,581,723 | 12/1996 | Hasbun et al. | 395/430 |

*Primary Examiner*—David L. Robertson
*Attorney, Agent, or Firm*—Nikaido, Marmelstein, Murray & Oram LLP

[57] ABSTRACT

A memory control method includes a first step of managing control information in each of memory blocks constituting the memory, the control information joining the memory blocks in a chain according to the frequency of data erasures occurring in each of the memory blocks; and a second step of determining, on the basis of the control information, a memory block that should be a transfer destination of write data.

15 Claims, 18 Drawing Sheets

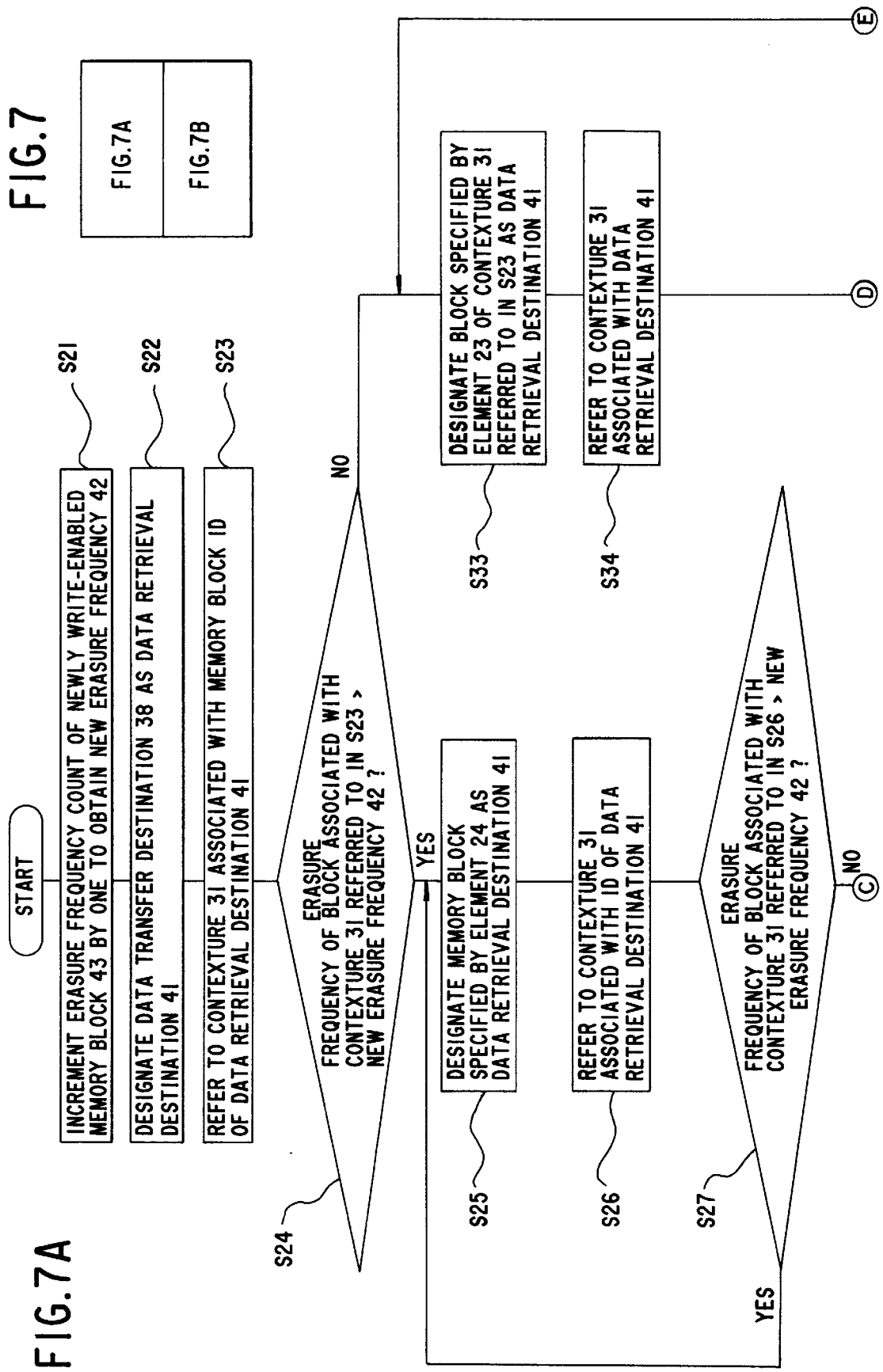

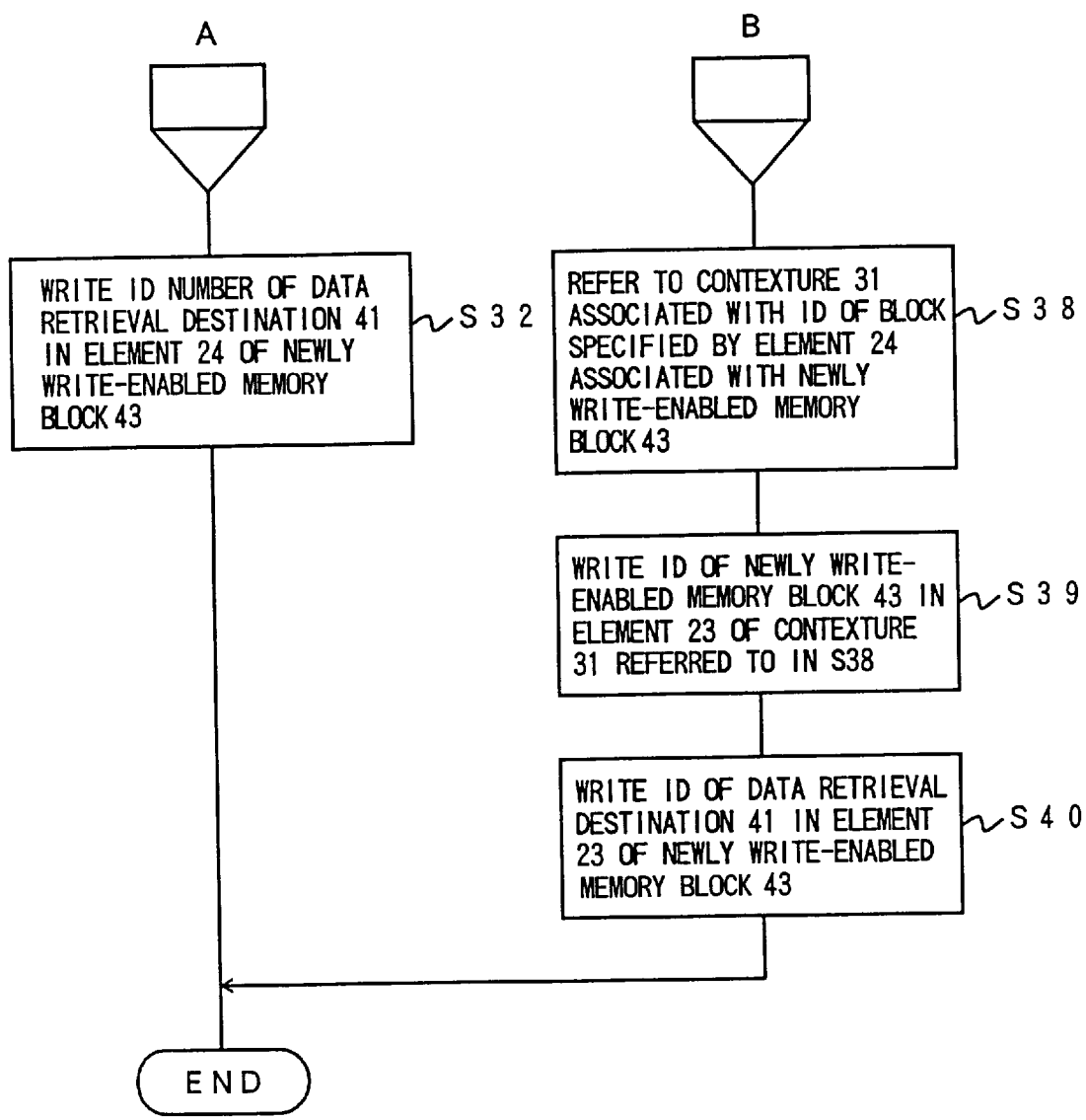

FIG. 9A

| MEMORY BLOCK ID NUMBER (x) | FREQUENCY OF ERASURES (w) |
|---|---|
| 0 | 8 |
| 1 | 4 → 6 |
| 2 | 6 |
| 3 | 8 |
| 4 | 4 |
| 5 | 3 → 6 |
| 6 | 9 |
| 7 | 5 → 6 |
| 8 | 2 → 6 |
| 9 | 1 → 6 |
| 10 | 3 |
| 11 | 2 |
| 12 | 5 |
| 13 | 7 |
| 14 | 9 |
| 15 | 6 |
| 16 | 5 |
| 17 | 1 |
| 18 | 3 |
| 19 | 8 |
| 20 | 7 |

FIG. 11A

| REPRESENTATIVE ORDER ||
| MEMORY BLOCK ID NUMBER (z) | FREQUENCY OF ERASURES (y) |
| --- | --- |
| 0 | MAXIMUM FREQUENCY OF ERASURES |
| 1 | MAXIMUM FREQUENCY OF ERASURES |
| 2 | MAXIMUM FREQUENCY OF ERASURES |
| 3 | MAXIMUM FREQUENCY OF ERASURES |
| 4 | MAXIMUM FREQUENCY OF ERASURES |

FIG. 11B

| REPRESENTATIVE ORDER ||
| MEMORY BLOCK ID NUMBER (z) | FREQUENCY OF ERASURES (y) |
| --- | --- |
| 0 | 8 |
| 1 | MAXIMUM FREQUENCY OF ERASURES |
| 2 | MAXIMUM FREQUENCY OF ERASURES |
| 3 | MAXIMUM FREQUENCY OF ERASURES |
| 4 | MAXIMUM FREQUENCY OF ERASURES |

| REPRESENTATIVE ORDER | |
|---|---|
| MEMORY BLOCK ID NUMBER (z) | FREQUENCY OF ERASURES (y) |
| 1 | 4 |
| 0 | 8 |
| 2 | MAXIMUM FREQUENCY OF ERASURES |
| 3 | MAXIMUM FREQUENCY OF ERASURES |
| 4 | MAXIMUM FREQUENCY OF ERASURES |

| REPRESENTATIVE ORDER | |
|---|---|
| MEMORY BLOCK ID NUMBER (z) | FREQUENCY OF ERASURES (y) |
| 5 | 3 |
| 1 | 4 |
| 0 | 8 |
| 3 | MAXIMUM FREQUENCY OF ERASURES |
| 4 | MAXIMUM FREQUENCY OF ERASURES |

FIG. 11E
| REPRESENTATIVE ORDER | |
|---|---|
| MEMORY BLOCK ID NUMBER (z) | FREQUENCY OF ERASURES (y) |
| 5 | 3 |
| 1 | 4 |
| 7 | 5 |
| 0 | 8 |
| 4 | MAXIMUM FREQUENCY OF ERASURES |
FIG. 11F
| REPRESENTATIVE ORDER | |
|---|---|
| MEMORY BLOCK ID NUMBER (z) | FREQUENCY OF ERASURES (y) |
| 8 | 2 |
| 5 | 3 |
| 1 | 4 |
| 7 | 5 |
| 0 | 8 |
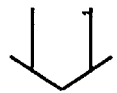
FIG. 11G
| REPRESENTATIVE ORDER | |
|---|---|
| MEMORY BLOCK ID NUMBER (z) | FREQUENCY OF ERASURES (y) |
| 9 | 1 |
| 8 | 2 |
| 5 | 3 |
| 1 | 4 |
| 7 | 5 |

F I G. 1 2
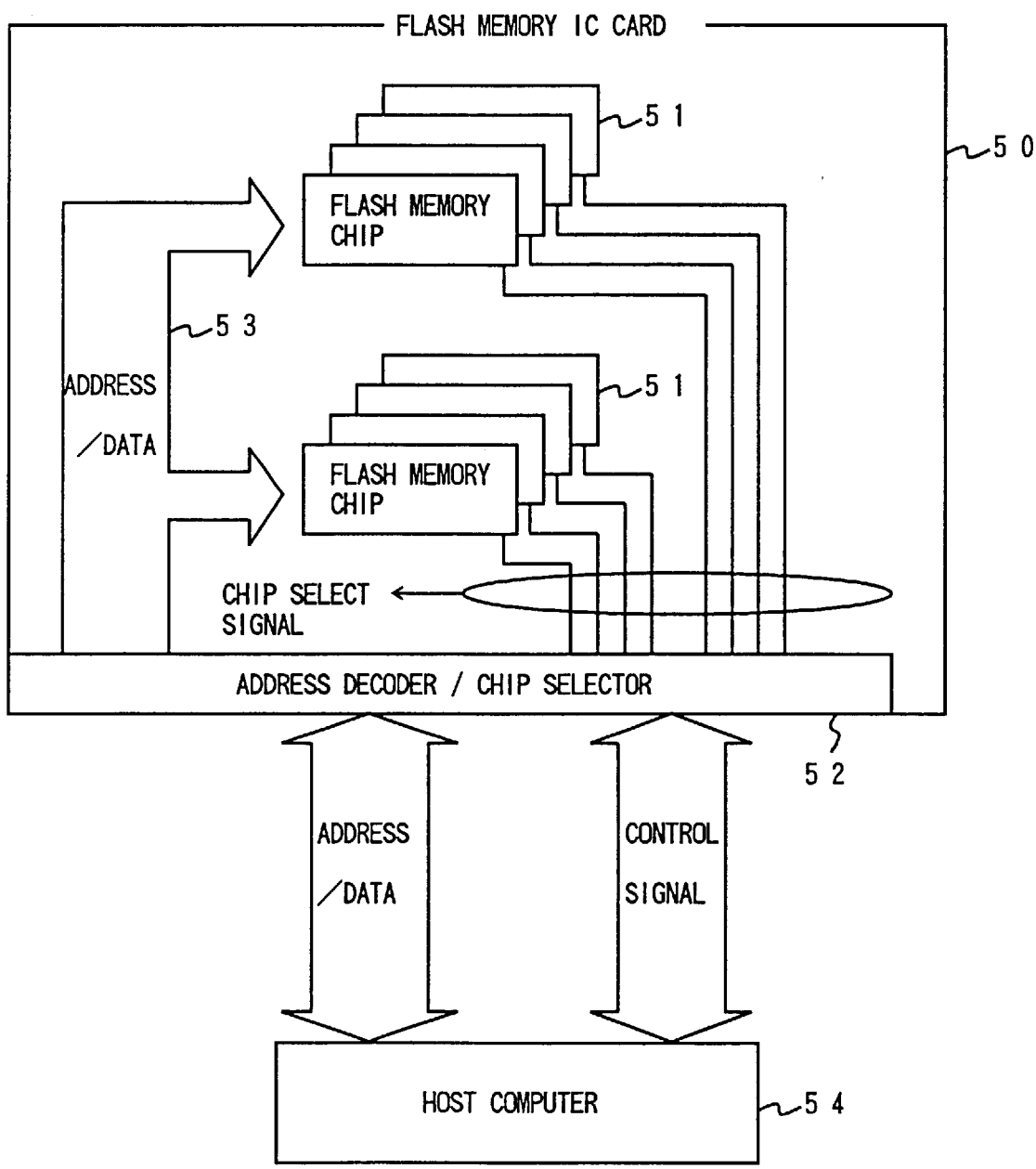

CONTROL METHOD IN WHICH FREQUENCY OF DATA ERASURES IS LIMITED

BACKGROUND OF THE INVENTION

1. Field of the Invention

The present invention relates to a control method for controlling a memory in which the frequency of occurrences of data erasures is limited, and apparatuses using this control method, and more particularly to a control method for smoothing out the frequency of rewriting operations over the blocks in the memory and an apparatus using the same control method.

A flash memory is known as a memory in which the frequency of data erasures is limited. In a flash memory, an erasure occurs in units of memory blocks, and the frequency of data erasures in each memory block is limited. A memory block in which the limit is reached can no longer be used. It is desirable that an apparatus having a flash memory mounted therein remain operable till the end of its life without the capacity of the flash memory being decreased. For this reason, it is necessary to prevent rewriting operations from occurring more frequently in one memory block of the flash memory than in another, and to smooth out the frequency of rewriting operations (erasures) over the memory blocks.

2. Description of the Prior Art

FIG. 1 is a memory map of an NOR-type flash memory. The flash memory has the following characteristics. First, overwriting of data is impossible (data cannot be written unless an erasure occurs). Second, an erasure occurs in units of predetermined capacity. In the case of the construction shown in FIG. 1, an erasure occurs in units of 64 kilo bytes. Third, there is a limit to the frequency of erasures. Normally, an NOR-type flash memory has an upper limit of 100,000 times, and a NAND-type flash memory has an upper limit of 1,000,000 times. Fourth, a power supply for data backup is not necessary. An EEPROM has all the four characteristics described above and sometimes categorized as a flash memory. In the description given below, a memory having all the four features described above is generically referred to as a flash memory.

One control method for smoothing out the frequency of rewriting operations (erasures) over the memory blocks is to compare the frequency of erasures in one memory block one by one with that of another memory block so as to determine a memory block in which erasures have occurred less frequently than the other memory blocks, whereupon write data is transferred to the determined memory block in preference to the other memory blocks.

However, the conventional control method as described above compares the frequency of erasures in different memory blocks one by one each time a data transfer request arises. Hence, the larger the unit of erasure, the longer it takes for the determination, resulting in a problem in that it takes a long time for a data transfer to the flash memory to actually occur.

SUMMARY OF THE INVENTION

Accordingly, an object of the present invention is to provide a control method and an apparatus using the same method in which the aforementioned problem is eliminated.

Another and more specific object of the present invention is to provide a control method and an apparatus using the same method in which a process is carried out in a short time for smoothing out the frequency of rewriting operations over the memory blocks in a memory such as a flash memory characterized by a limitation in the frequency of rewriting operations.

In order to achieve the aforementioned objects, the present invention provides a memory control method for controlling a memory in which a frequency of data erasures that can occur in the memory is limited, the method comprising the steps of: 1) managing control information in each of memory blocks constituting the memory, the control information joining the memory blocks in a chain in accordance with the frequency of data erasures occurring in each of the memory blocks; and 2) determining, on the basis of the control information, a memory block that should be a transfer destination of write data. According to the memory control method of the present invention, the frequency of erasures is controlled by managing the control information for joining the memory blocks in a chain according to the frequency of data erasures which occur in the memory block. Hence, it is easy to determine a memory block that should be a transfer destination of write data in a short time, the determination being done by referring to the control information so that the frequency of erasures is smoothed out over the units. It will be appreciated that it is no longer necessary to make one-by-one comparison of the frequency.

In a preferred embodiment, the control information includes information which joins the memory blocks in an ascending order of frequency of data erasures, and information which joins the memory blocks in a descending order of frequency of data erasures. According to this aspect of the present invention, it is easy to determine a data transfer destination by following a chain formed of the memory blocks and to smooth out the frequency over the memory blocks.

In another preferred embodiment, the control information includes a contexture defined for each of the memory blocks constituting the memory, and wherein each contexture includes: first pointer information indicating a contexture associated with a memory block having the frequency of data erasures equal to or one step greater than the frequency of data erasures associated with the contexture including the first pointer information; and second pointer information indicating a contexture associated with a memory block having the frequency of data erasures equal to or one step lower than the frequency of data erasures associated with the contexture including the second pointer information. According to this aspect of the present invention, it is easy to determine a data transfer destination in such a manner that the frequency of erasures is smoothed out, by using the first pointer information and second pointer information.

In still another preferred embodiment, the first step comprises a step of managing only write-enabled memory blocks by joining the memory blocks in a chain using the control information. According to this aspect of the invention, the first step uses the control information to join only those memory blocks that are write enabled in a chain and manages the control information. Hence, an amount of data that is consulted in a process of determining a transfer destination is reduced.

In still another embodiment, the memory control method further comprises the step of: 3) joining a memory block that has just been write enabled to the chain of the existing memory blocks according to its frequency of data erasures. According to this aspect of the present invention, it is easy to update the chain.

In still another embodiment, the second step comprises the step of: searching the chain of memory blocks according to the control information, starting with the memory blocks initially specified by the write data as the transfer destination, and transferring the write data to the memory block having the lowest frequency of data erasures. According to this aspect of the present invention, it is easy to identify a memory block having the lowest frequency of erasures.

In still another embodiment, the memory control method further comprises the step of: 3) setting the first and second pointer information associated with the memory block that has just been write enabled, on the basis of the frequency of data erasures of the memory block that has just been write enabled and on the basis of the frequency of data erasures of the other write-enabled memory blocks, such that the memory block that has just been write enabled is built into the chain of the existing write-enabled memory blocks. According to this aspect of the present invention, it is easy to build a memory block that has just been write enabled in an existing chain.

The present invention also provides a memory control method for controlling a memory in which a frequency of data erasures that can occur in the memory is limited, said method comprising the steps of: 1) selecting a predetermined number of memory blocks constituting the memory and managing the frequency of data erasures of the selected memory blocks; and 2) determining a memory block that should be a destination of write data such that all or some of the selected memory blocks have the same frequency of data erasures. According to this memory control method of the present invention, it is easy to determine a memory block that should be a transfer destination of write data in a short time and using a relatively small amount of data, the determination being done in such a manner that the frequency of erasures is smoothed out over the memory blocks.

In a preferred embodiment of the above method, the first step comprises the step of: selecting the predetermined number of different memory blocks when some or all of the selected predetermined number of memory blocks have the same frequency of data erasures through the second step, and managing the frequency of data erasures of the selected predetermined number of different memory blocks. According to this aspect of the present invention, it is possible to smooth out the frequency of erasures over all the memory blocks of the memory.

In another preferred embodiment, the first step comprises the step of selecting a predetermined number of memory blocks having a relatively low frequency of data erasures or a relatively great frequency of data erasures.

The present invention also provides an apparatus comprising: a memory in which a frequency of data erasures is limited; first means for managing control information in each of memory blocks constituting the memory, the control information joining the memory blocks in a chain according to the frequency of data erasures occurring in each of the memory blocks; and second means for determining, on the basis of the control information, a memory block that should be a transfer destination of write data. According to the apparatus of the present invention, it is easy to determine a memory block that should be a transfer destination of write data in a short time, the determination being done by referring to the control information in such a manner that the frequency of erasures is smoothed out over the units. It will be appreciated that it is no longer necessary to make one-by-one comparison of the frequency.

In a preferred embodiment, the apparatus of the present invention further comprises: a memory in which a frequency of data erasures is not limited; and data transfer control means for controlling data transfer between the memory and the memory in which the frequency of data erasures is limited.

In another preferred embodiment, the apparatus further comprises data transfer control means for controlling data transfer between an externally connected memory in which the frequency of data erasures is not limited and the memory in which the frequency of data erasures is limited. This feature of the present invention is useful in a flash memory semiconductor disk or the like in that it is easy to determine a memory block that should be a transfer destination of write data in a short time, the determination being done by referring to the control information in such a manner that the frequency of erasures is smoothed out over the units. It will be appreciated that it is no longer necessary to make one-by-one comparison of the frequency.

The present invention also provides an apparatus for controlling a memory in which a frequency of data erasures is limited, the apparatus comprising: first means for managing control information in each of memory blocks constituting the memory, the control information joining the memory blocks in a chain according to the frequency of data erasures occurring in each of the memory blocks; and second means for determining, on the basis of the control information, a memory block that should be a transfer destination of write data. This feature of the present invention is useful in a flash memory semiconductor disk or the like in that it is easy to determine a memory block that should be a transfer destination of write data in a short time, the determination being done by referring to the control information in such a manner that the frequency of erasures is smoothed out over the units. It will be appreciated that it is no longer necessary to make one-by-one comparison of the frequency.

BRIEF DESCRIPTION OF THE DRAWINGS

Other objects and further features of the present invention will be apparent from the following detailed description when read in conjunction with the accompanying drawings, in which:

FIG. 8 is a flowchart (part 2) explaining a process wherein elements (pointers) of the contexture associated with a newly write-enabled memory block are set and elements of the relevant contextures are modified;

FIGS. 9A and 9B are diagrams explaining a second embodiment of the present invention;

FIGS. 11A–11G are diagrams showing transition of data processed according to the flowchart of FIG. 10;

FIG. 12 is a block diagram showing a third embodiment of the present invention;

DESCRIPTION OF THE PREFERRED EMBODIMENTS

A description will now be given of a first embodiment of the present invention.

Figure 1:
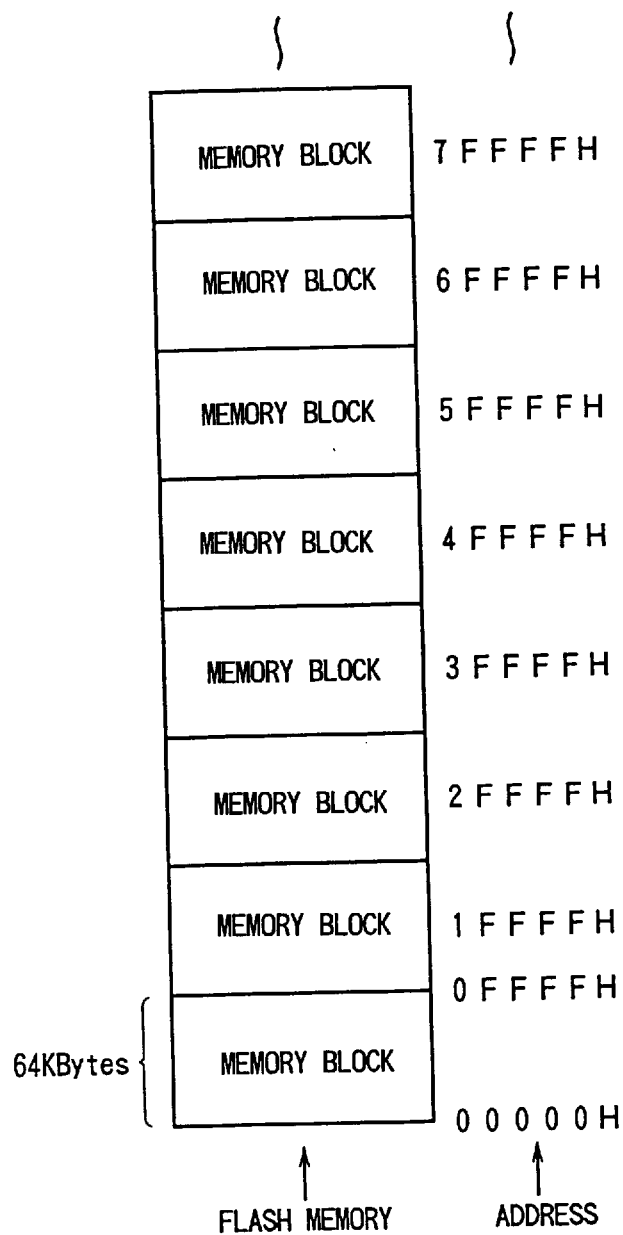
FIG. 1 is a diagram explaining a memory block of a flash memory.
Figure 2:
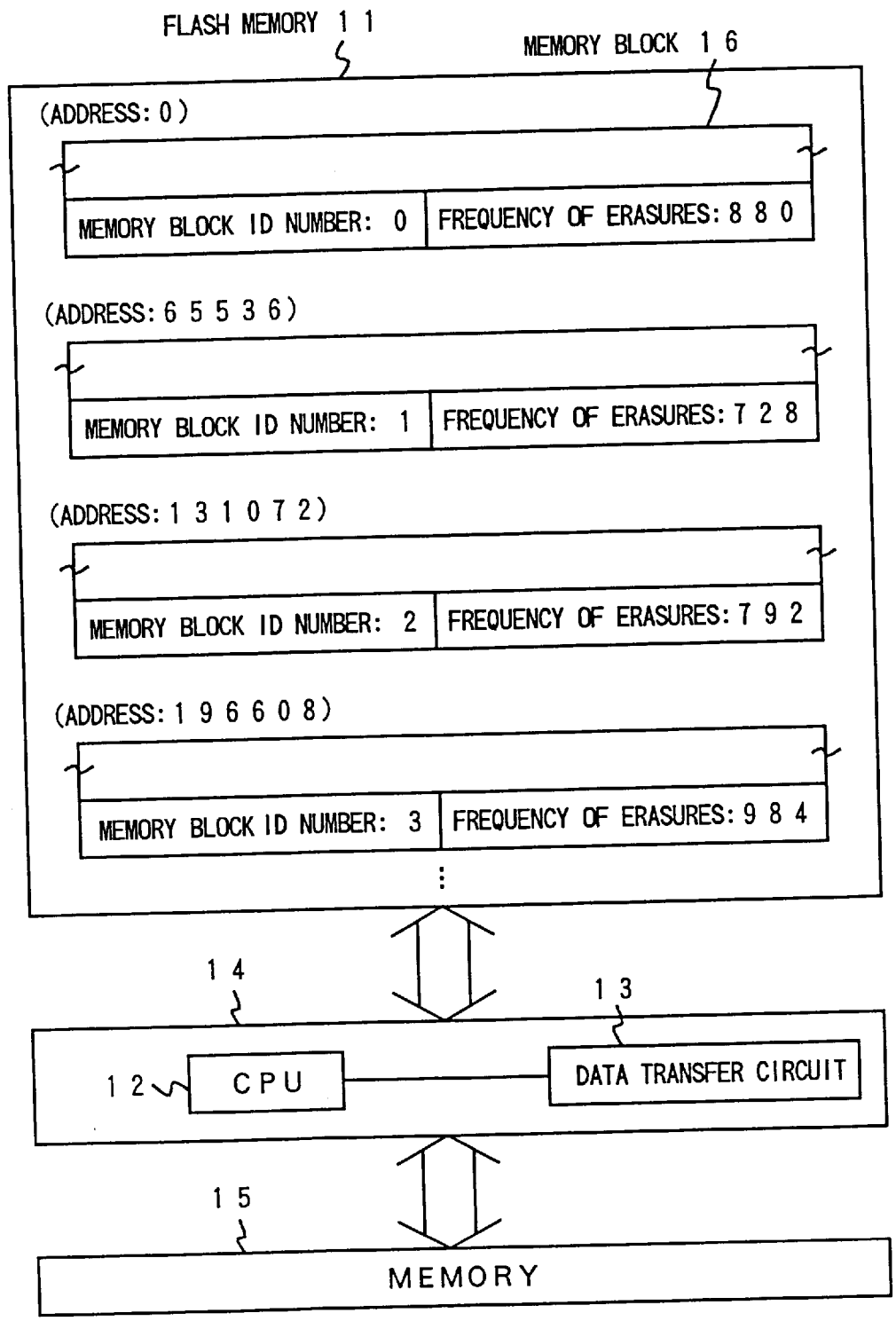
FIG. 2 is a block diagram showing an example of construction of a system in which a method for smoothing out the erasure frequency is used.

FIG. 2 is a block diagram showing a construction of a system in which a control method of the present invention is used. The system shown in FIG. 2 comprises a flash memory 11, a control unit 14 and a second memory 15 provided separately from the flash memory 11. The control unit 14 has a CPU 12 and a data transfer circuit 13. The data transfer circuit 13 is embodied, for example, by a DMA (Direct Memory Access) controller. In case that the entirety of the controller 14 is composed of a CPU, both the blocks 12 and 13 are realized by the CPU executing predetermined programs.

The flash memory 11 is segmented into a plurality of memory blocks 16, data being erased and written in these units. For the convenience sake, FIG. 2 shows four memory blocks indicated by memory block ID numbers "0–3", respectively. The information indicating the frequency of erasures of each memory block is stored in a first 1 byte of the memory block. For example, FIG. 2 indicates that 880 erasures have occurred in the memory block having a memory block ID number "0". The control unit 14 controls the operation of the whole system. For example, the CPU 12 determines which memory block is used in writing data read from the memory 15, and the data transfer circuit 13 effects an actual data transfer.

Figure 3:
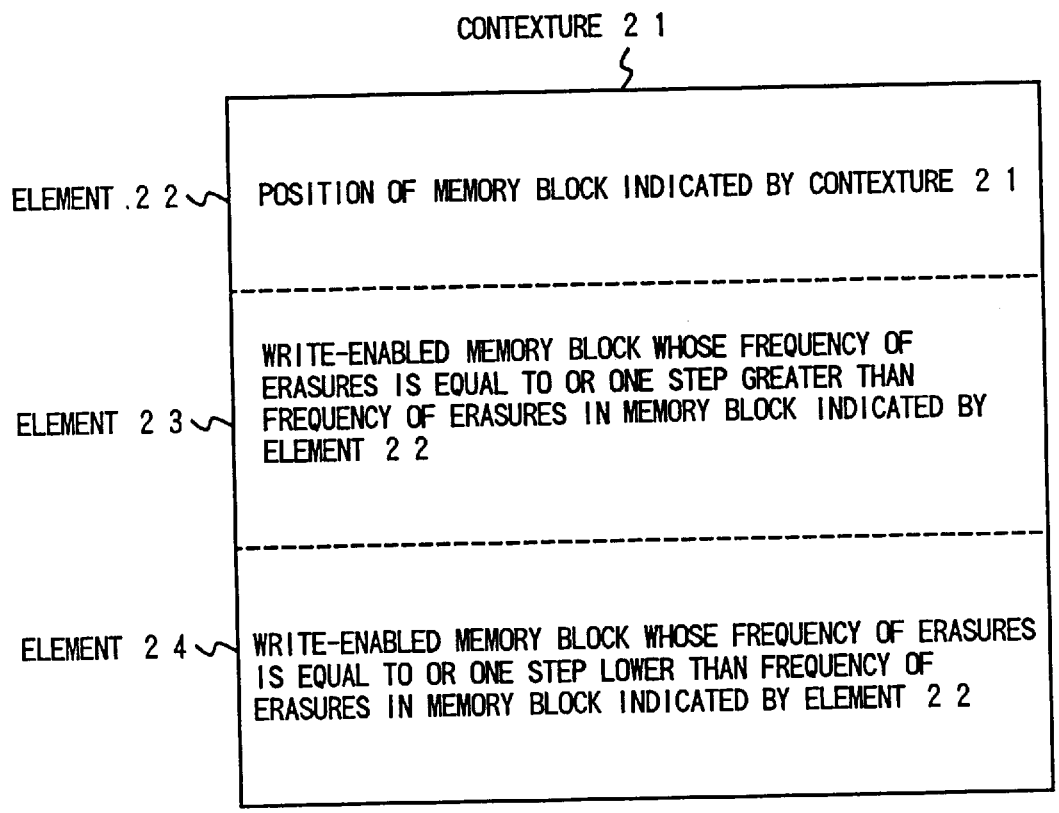
FIG. 3 is a diagram showing a construction of a contexture used in a first embodiment of the present invention.

In the present method for smoothing out the frequency of rewriting operations, a contexture (i.e., control information unit) 21 defined as shown in FIG. 3 is used. The contexture 21 is a set of pointer information defined for each memory block, and comprises three elements 22, 23 and 24. The element 22 is information indicating the position of the memory block. The element 23 is information (a pointer) indicating a write-enabled memory block whose frequency of erasures is equal to or one step greater than the frequency of erasures in the memory block indicated by the element 22. The element 24 is information (a pointer) indicating a write-enabled memory block whose frequency of erasures is equal to or one step lower than the frequency of erasures in the memory block indicated by the element 22. As will be described later, the contexture 21 does not necessarily have all the three elements 22–24. The element 22 may be omitted in the contexture 21 by arranging the contextures 21 in the order of memory block ID numbers.

The contexture 21 as shown in FIG. 3 is prepared when the system is started and stored in a rewritable recording medium (for example, the memory 15 or the flash memory 11 shown in FIG. 2).

Figure 4:
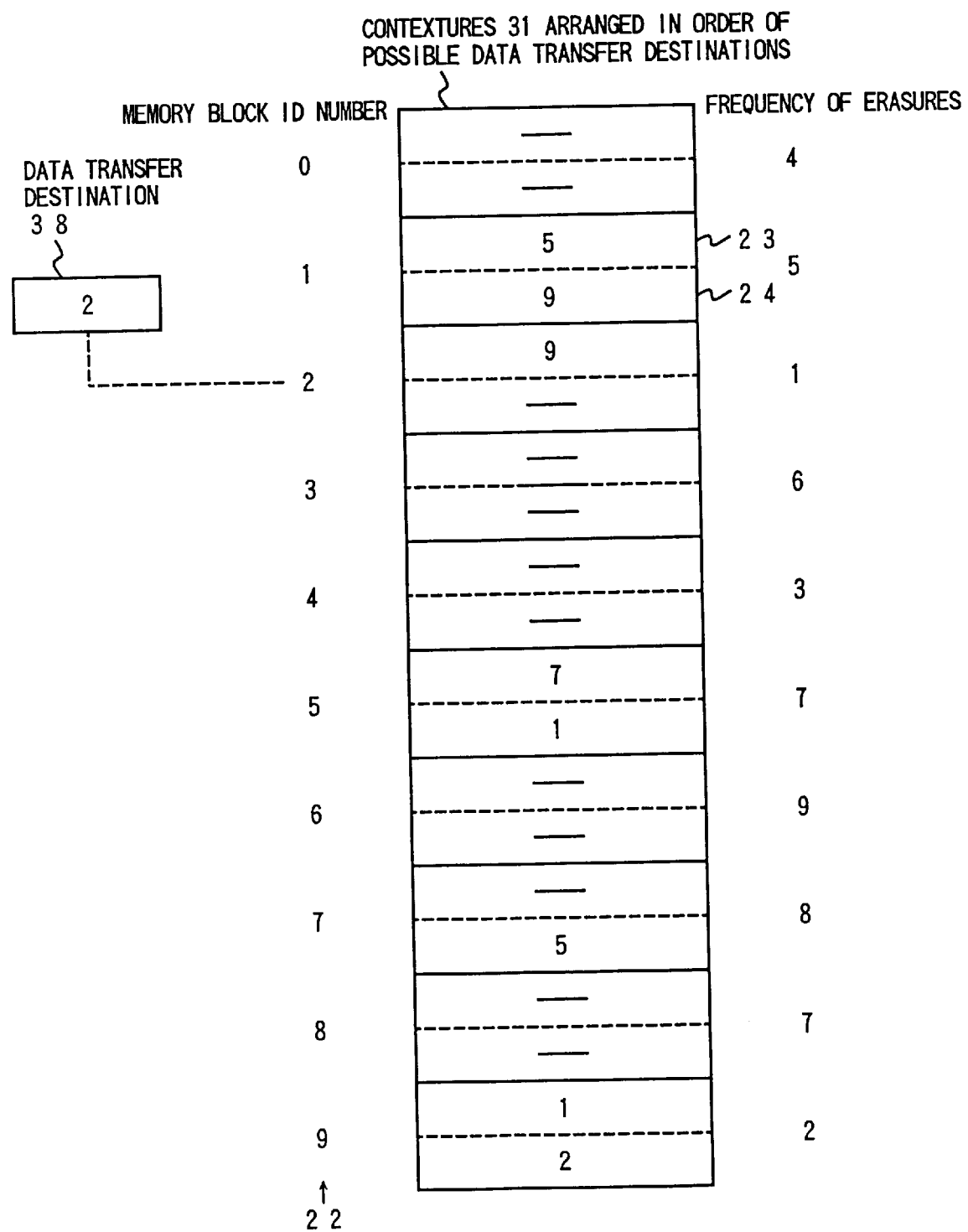
FIG. 4 is a diagram explaining a process for determining a write data transfer destination (destination memory block) in a flash memory by referring to the contexture shown in FIG. 3.

FIG. 4 explains a process for determining a destination (memory block) of write data in the flash memory 11 by referring to the contexture 21. In the example of FIG. 4, the contextures 21 are arranged in the order of memory block ID numbers. That is, the arrangement of the contextures corresponds to the element 22, and each of the contextures 21 in FIG. 4 has only the elements 23 and 24. Hereinafter, the contexture such as the ones shown in FIG. 4 will be referred to as a contexture 31. Memory blocks associated with those contextures 31 in FIG. 4 that have dashes ("-") in the elements 23 and 24 are write inhibited. For example, the memory block having the memory block ID number "0" is write inhibited. Memory blocks associated with the other contextures are write enabled. In the example of FIG. 4, the memory blocks specified by the memory block ID numbers 1, 2, 5, 7 and 9 are write enabled. The element 23 of the contexture 31 corresponding to the memory block ID number "1" is "5", and the element 24 thereof is "9". That the element 23 is "5" indicates a fact that the write-enabled memory block having a frequency of erasures (frequency of rewriting operations) equal to or one step greater than the frequency of erasures (five times, in the example of FIG. 4) in the memory block having the memory block ID number "1" has a memory block ID number "5". Omitting those memory blocks that are write inhibited, one can note in FIG. 4 that a frequency of erasures one step greater than the frequency of "5" is "7". That the element 24 of the contexture 31 associated with the memory block ID number "1" is "9" indicates a fact that the write-enabled memory block having a frequency of erasures (frequency of rewriting operations) equal to or one step lower than the frequency of erasures in the memory block having the erasure ID number "1" has an erasure ID number "9". Omitting those memory blocks that are write inhibited, one can note in FIG. 4 that a frequency of erasures one step lower than the frequency of "5" is "2". Hence, the element 24 of the contexture 31 associated with the memory block ID number "1" specifies the memory block ID number "9".

Figure 5:
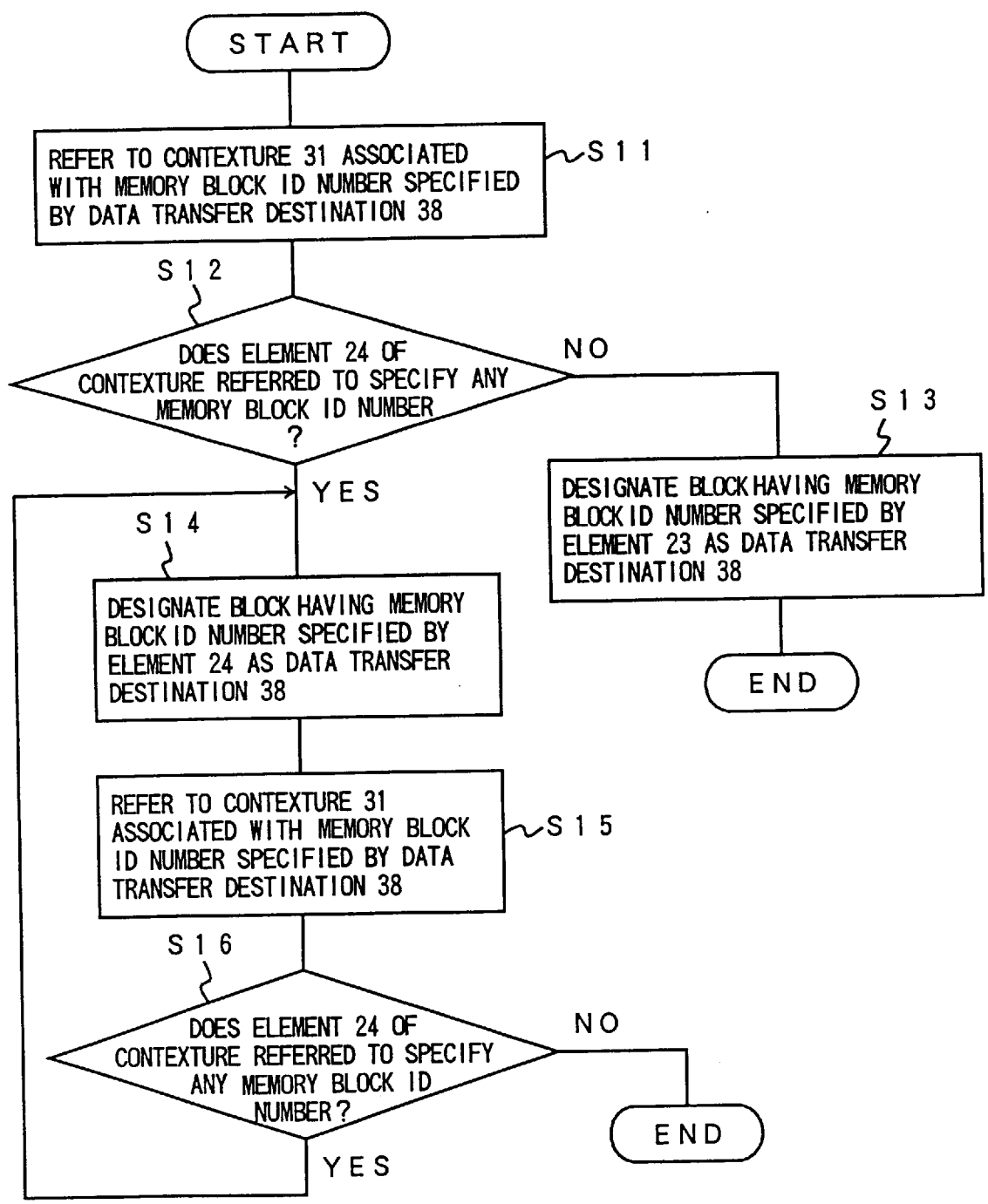
FIG. 5 is a flowchart explaining a process of the first embodiment for smoothing out the erasure frequency.

FIG. 5 is a flowchart showing a process for determining a destination of data in the flash memory 11. This process is executed by the CPU 12 of the control unit 14 shown in FIG. 2. In a step S11 (hereinafter, steps are simply referred to as S11, S12, . . . etc.), the CPU 12 refers to the contexture 31 associated with the memory block ID number specified by a data transfer destination 38 (see FIG. 4). In S22, the CPU 12 determines whether or not the element 24 of the contexture 21 referred to specifies any memory block ID number. If a negative result is yielded in S22, the CPU 12 executes S13, wherein the memory block ID number specified by the element 23 of the contexture 31 referred to is determined as a data transfer destination, and the process is terminated. That is, in case the contexture 31 associated with the memory block specified as the data transfer destination 38 has the element 24 vacant, there is no memory block having lower frequency of erasures than the specified memory block, so that data is written in the memory block specified.

A positive result in S22 means that there exits a memory block having a lower frequency of erasures than the memory block specified as the data transfer destination 38. Successive determination of memory blocks having a lower frequency than the memory block specified as the data transfer destination 38 is made in S14–S16 described below. In S14, the CPU 12 determines that the memory block specified by the element 24 as a new data transfer destination 38. In S15, the CPU 12 refers to the contexture 31 associated with the memory block ID number specified by the data transfer destination 38. In S16, a determination similar to the one in S12 is made. That is, the CPU 12 determines whether or not the element 24 of the contexture 31 referred to specifies any memory block ID number. A negative result in S16 means that there is no memory block having a lower frequency of erasures than the memory block associated with the contexture 31. Hence, the process is terminated. A positive result in S16 means that there exits a memory block having a lower frequency of erasures than the memory block associated with the contexture 31. The operational flow then returns to S14, whereupon steps S14–S16 are cycled through until S16 yields a negative result. In this way, data is written in a memory block having the smallest frequency of erasures.

In the example of FIG. 4, the memory block having the ID number "2" is specified as the data transfer destination 38. Since the result in S12 is negative, data is written in the memory block having the ID number "2". If some write data fails to be written there, the remaining data is written in the data transfer destination specified in S13, that is, the memory block having the ID number "9" in the example shown in FIG. 4.

If the initial data transfer destination 38 is the memory block having the ID number "9" instead of "2", the result in S12 is positive. In S14, the memory block having the ID number "2" is specified by the element 24 as the data transfer destination 38. Since the result yielded in S16 is negative, subsequent data is written in the memory block having the ID number "2".

When the process shown in FIG. 5 is completed, the CPU 12 updates the contextures 31. For example, when data is written in the memory block having the ID number "2", the element 23 of the contexture 31 associated with the ID number "2" is cleared and the unit having the ID number "2" is write inhibited. Further, the element 24 of the contexture 31 associated with the memory block ID number "9" which had been specified by the element 23 is cleared. This clearance indicates that there is no write-enabled memory block having lower erasure frequency than the frequency (two times) of the memory block having the ID number "9".

When a memory block becomes write enabled, the elements 23 and 24 of the memory block that has just been write enabled (hereinafter, referred to as the newly write-enabled memory block) are determined, and the elements 23 and 24 of the relevant units are modified. A description will now be given of this process with reference to FIGS. 6, 7 and 8.

Figure 6:
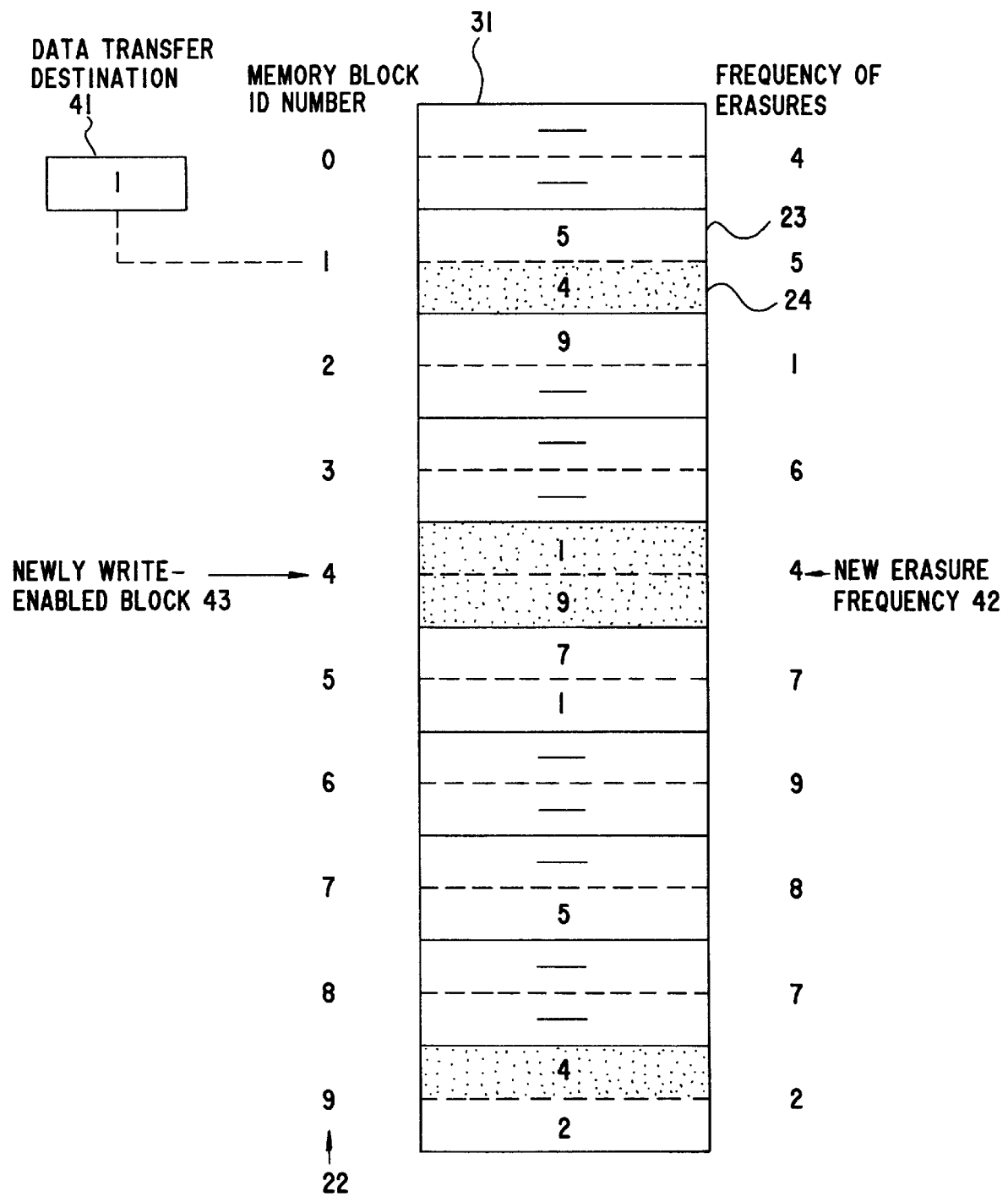
FIG. 6 is a diagram explaining a process wherein elements (pointers) of the contexture associated with a newly write-enabled memory block are set and elements of the relevant contextures are modified.

FIG. 6 shows a case where a newly write-enabled memory block 43 has the memory block ID number 4. Since the entirety of the data in the memory block 43 is deleted, the erasure frequency of the newly write-enabled memory block 43 is updated to four times. The elements 23 and 24 of the contexture 31 which corresponds to the memory block 43 are set to "1" and "9", respectively. Simultaneously, the element 24 of the contexture 31 which corresponds to the memory block ID number "1" is changed from "9" to "4", and the element 23 of the contexture 31 which corresponds to the memory block ID number "9" is changed from "1" to "4". This process is effected by the CPU 12 shown in FIG. 2 performing the process shown in FIGS. 7 and 8.

Figure 7B:
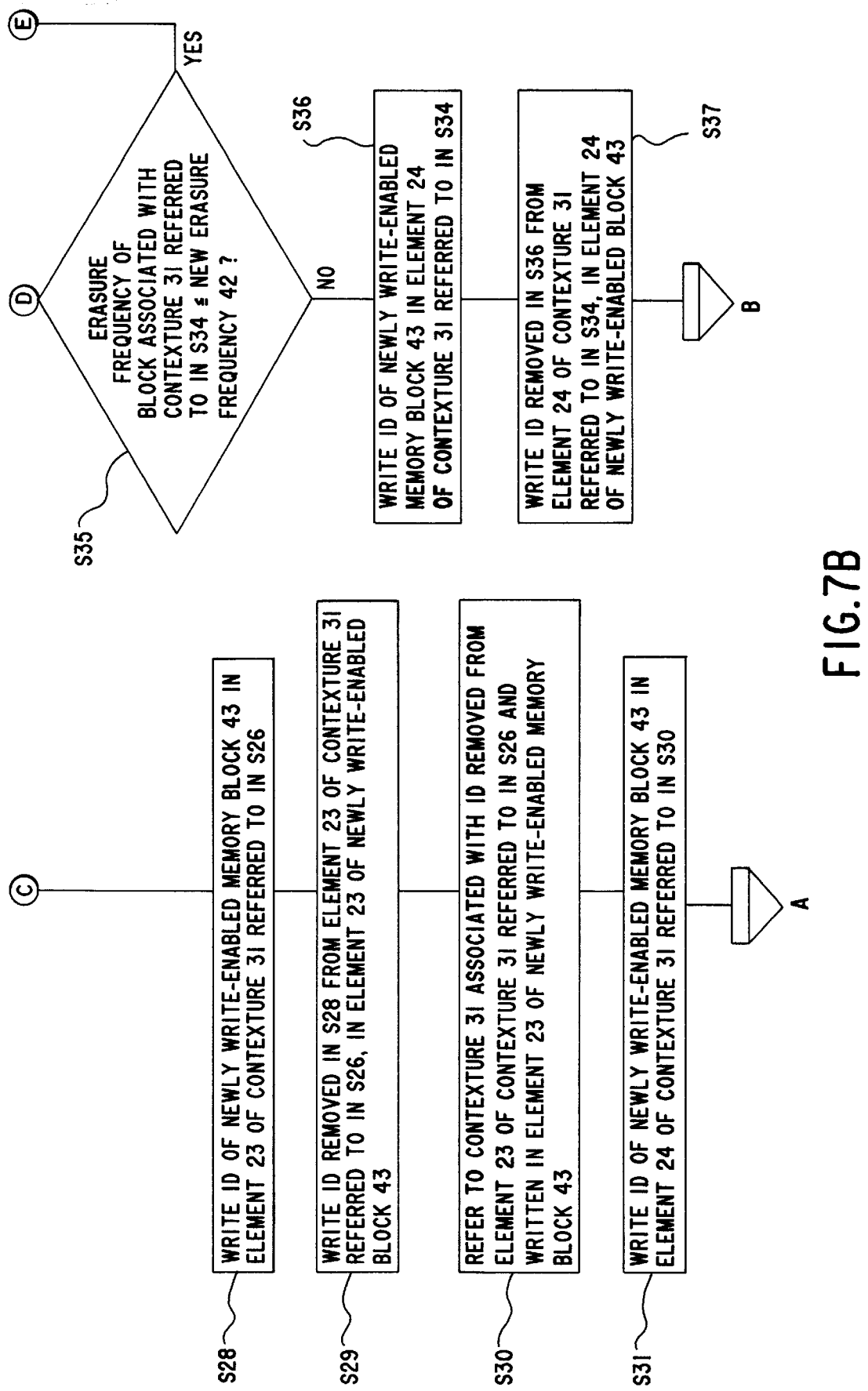
FIG. 7 is a flowchart (part 1) explaining a process wherein elements (pointers) of the contexture associated with a newly write-enabled memory block are set and elements of the relevant contextures are modified.

In S21 of FIG. 7, the CPU 12 increment the erasure frequency count of the newly write-enabled memory block 43 by one to obtain a new erasure frequency 42. In S22, the CPU 12 designates the data transfer destination 38 as a data retrieval destination 41. In S23, the CPU 12 refers to the contexture 31 associated with the memory block ID number of the data retrieval destination 41. In S24, the CPU 12 makes a determination as to whether or not the erasure frequency of the unit associated with the contexture 31 referred to in S23 is greater than the new erasure frequency 42. If the result yielded in S24 is positive, the CPU 12 designates, in S25, a memory block specified by the element 24 as the data retrieval destination 41. In S26, the CPU 12 refers to the contexture 31 associated with the memory block ID number of the data retrieval destination 41. In S27, the CPU 12 makes a determination similar to the one made in S24; that is, the CPU 12 determines whether or not the erasure frequency of the unit associated with the contexture 31 referred to is greater than the new erasure frequency 42. If the result yielded in S27 is positive, the operation flow returns to S25, whereupon the CPU 12 executes the steps S25–S27 until the result yielded in S27 becomes negative.

If the result yielded in S27 is negative, the operation flow proceeds to S28, wherein the CPU 12 writes the ID of the newly write-enabled memory block 43 in the element 23 of the contexture referred to in S26. In S29, the CPU 12 writes the ID removed in S28 from the element 23 of the contexture referred to in S26 to the element 23 of the newly write-enabled memory block 43. In S30, the CPU 12 refers to the contexture 31 associated with the ID number removed from the element 23 of the contexture referred to in S26 and written in the element 23 of the newly write-enabled memory block 43. In S31, the CPU 12 writes the ID number of the newly write-enabled memory block 43 in the element 24 of the unit associated with the contexture 31 referred to in S30. In S32 shown in FIG. 8, the CPU 12 writes the ID number of the data retrieval destination 41 to the element 24 of the newly write-enabled memory block 43.

If the result yielded in S24 is negative in S24 of FIG. 7, the operation flow proceeds to S33, wherein the CPU 12 designates a unit associated with the data (ID number) in the element 23 of the contexture 31 referred to in S23, as the data retrieval destination 41. In S34, the CPU 12 refers to the contexture 31 associated with the ID number of the unit specified as the data retrieval destination 41. In S35, the CPU 12 makes a determination as to whether or not the erasure frequency of the unit associated with the contexture 31 referred to in S34 is equal to or smaller than the new erasure frequency 42. If the result yielded in S35 is positive, the operation flow returns to S33, wherein the CPU 12 executes the steps S33–S35 until the result yielded in S35 is negative.

If the result yielded in S35 is negative, the operation flow proceeds to S36, wherein the CPU 12 writes the ID number of the newly write-enabled memory block 43 in the element 24 of the contexture referred to in S34. In S37, the CPU 12 writes the ID number removed from the element 24 of the contexture referred to in S34 to the element 24 of the newly write-enabled unit 43. In S38 shown in FIG. 8, the CPU 12 refers to the contexture 31 associated with the ID number of the unit specified by the element 24 associated with the newly write-enabled unit 43. In S39, the CPU 12 writes the ID number of the newly write-enabled memory block 43 to the element 23 of the contexture 31 referred to in S38. Finally, in S40, the CPU 12 writes the ID number of the data retrieval destination 41 to the element 23 of the newly write-enabled memory block 43.

The above described process will now be described again through an example shown in FIG. 6. Assume that the hatched elements in FIG. 6 have not been updated. In other words, assume that the elements except those associated with the memory block ID number "4" are identical to those of FIG. 4, and that the steps S21, S22 and S23 have been executed. The contexture 31 referred to in S23 is associated with the memory block ID number "1" so that the result yielded in S24 is positive. In S25, the memory block ID number "9" specified by the element 24 associated with the memory block ID number "1" is set to be the data retrieval destination 41. In S26, the contexture 31 associated with the memory block ID number "9" is referred to. In this case, the result in S27 is negative. In S28, the data "4" is written in the element 23 of the contexture 31 associated with the memory block ID number "9", "4" being the ID number of the newly write-enabled memory block 43. In S29, the data "1" removed from the element 23 of the contexture referred to in S26 is written in the element 23 of the contexture 31 associated with the ID number "4" of the newly write-enabled memory block 43. In S30, the contexture 31 associated with the ID number "1" which the element 23 of the newly write-enabled memory block 43 specifies is referred to. In S31, the data "4" is written in the element 24 of the contexture 31 associated with the memory block ID number 1, "4" being the ID number of the newly write-enabled memory block 43. In S32, the data "9" is written in the element 24 of the contexture 31 associated with the newly write-enabled memory block 43, "9" being the ID number of the memory block designated as the data retrieval destination.

As described above, the newly write-enabled memory block 43 is built into a chain composed of the write-enabled memory blocks.

A description will now be given of a second embodiment of the present invention.

Figure 9B:
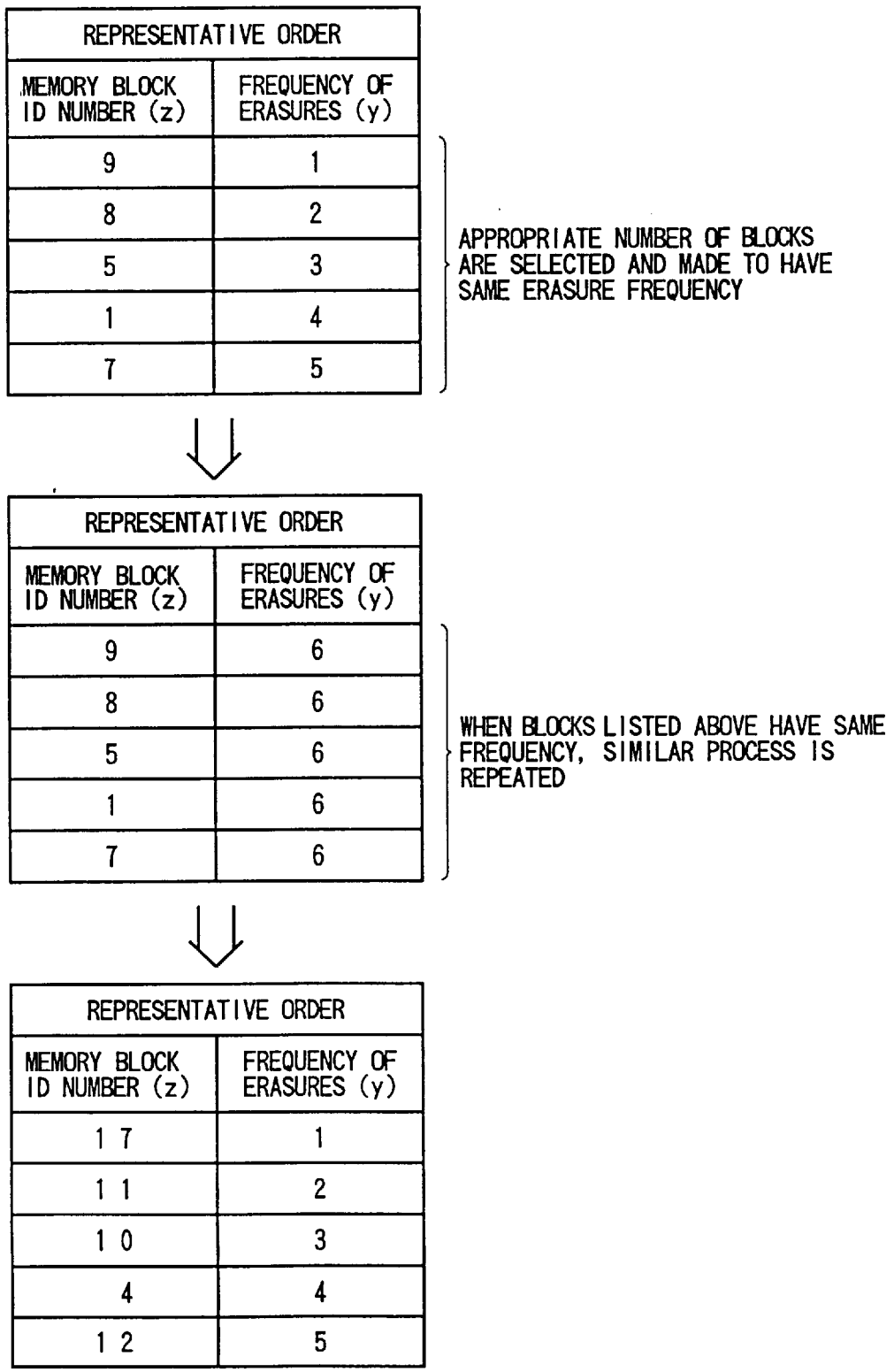

FIGS. 9A and 9B schematically explain the second embodiment. In the second embodiment, a predetermined number of memory blocks having a relatively low frequency of rewriting operations are selected from among the memory blocks (a total of 21 units are listed in FIG. 9A). Alternatively, a predetermined number of memory blocks having a relatively great frequency may be selected. Data transfer is effected to make sure that the selected memory blocks have the same frequency of rewriting operations. Theoretically, any group of memory blocks may be selected.

Referring to FIG. 9B, five memory blocks are selected from among the units shown in FIG. 9A and listed in the ascending order of erasure frequency so that no two units have the same erasure frequency in the list. In the example shown in FIG. 9B, the memory blocks 9, 8, 5, 1 and 7 are selected and arranged to constitute a representative order (chain). Data is transferred to these units in preference to the other units. That is, data is not transferred to the other units until the five memory blocks have the same erasure frequency. When these five units have the same erasure frequency, another set of five memory blocks is selected. In the example shown in FIG. 9B, the memory blocks 17, 11, 10, 4 and 12 are selected.

Figure 10:
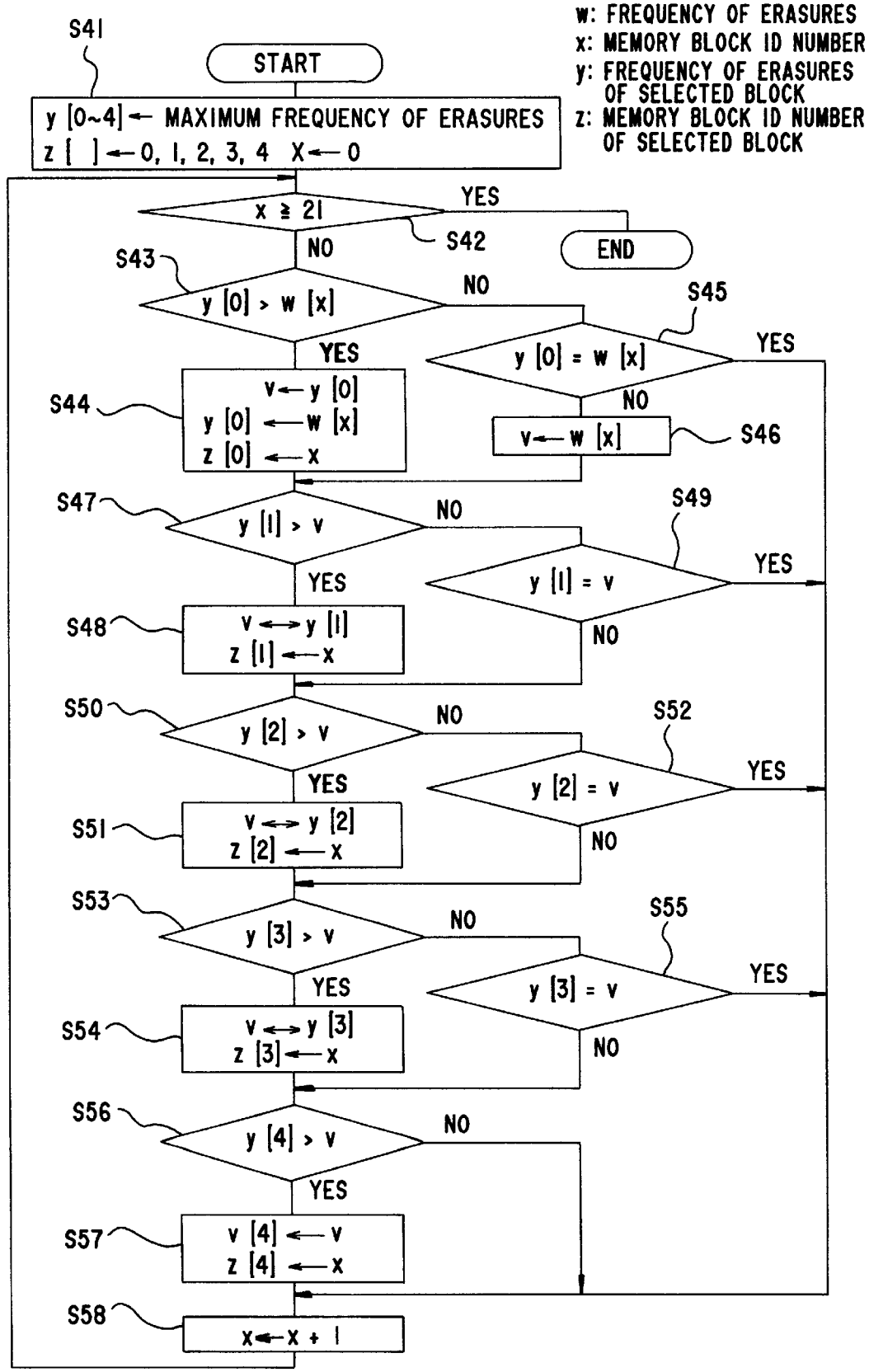
FIG. 10 is a flowchart showing a process of the second embodiment.

FIG. 10 is a flowchart showing a process according to the second embodiment. This process is executed by the CPU 12 shown in FIG. 2. An explanation will be give of the definition of symbols used in FIG. 10. "v" indicates a temporary parameter. "w" indicates the frequency of erasures listed in FIG. 9A, and "x" indicates the memory block ID number listed in FIG. 9A. "y" indicates the frequency of erasures of the selected memory blocks listed in FIG. 9B, "z" indicates the memory block ID number of the selected memory block shown in FIG. 9B.

Figures 11C, 11D:
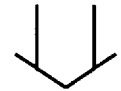

A description will now be given of the process shown in FIG. 10, with reference to FIGS. 11A–11G. The CPU 12 sets the erasure frequency y of selected units to be a maximum erasure frequency MAX inherent in the flash memory, sets the memory block ID numbers z of the selected units to be 0–4, and selects 0 as the memory block ID number. The result yielded in S41 is shown in Fig. 11A. In S42, the CPU 12 makes a determination as to whether or not x is equal to or greater than 21. If the result yielded in S42 is positive, the process is terminated. If the result yielded in S42 is negative, the operation flow proceeds to S43, wherein the CPU 12 makes a determination as to whether or not the erasure frequency of the memory block ID number "0", that is, y [0] (=MAX), is greater than the erasure frequency of the unit having the memory block ID number x (initially, x=0), that is, w [x]. In the example shown in FIGS. 9A and 9B, x [0]=8 so that the result yielded in S43 is positive. Thereupon, in S44, the CPU 12 substitute y [0] for the temporary parameter v, substitute w [x] for y [0], and substitute x for z [0]. Since y [0]=MAX, the erasure frequency for the selected memory block ID number "0", that is, y [0] is 8, as shown in FIG. 11B. If the result yielded in S43 is negative, the CPU 12 makes a determination in S45 whether or not y [0] is equal to w [x]. If the result yielded in S45 is positive, the operation flow proceeds to S58. If the result yielded in S45 is negative, the CPU 12 substitutes w [x] for x in S46.

FIGS. 11C–11G explain how the following steps are executed. Specifically, the steps select memory blocks having a lower erasure frequency than the erasure frequency of the units selected already. The memory block ID number of a newly selected unit is written in z [0], and the associated erasure frequency is written in y [0]. The memory block ID numbers selected already and the associated erasure frequency are displaced one step lower in the list. For example, referring to FIG. 11C, when the erasure frequency of 3, which is lower than the erasure frequency of 4 already listed, is retrieved, the newly retrieved memory block ID number 5 and the associated erasure frequency of 3 are registered at the top of the list, and the two memory blocks that had been already selected are moved one step lower in the list. The rest of the steps are executed in a similar manner so that, finally, the representative order as shown in FIG. 11G is obtained.

Referring back to FIG. 10, the CPU 12 makes a determination in S47 as to whether or not y [1] is greater than v. If the result yielded in S47 is positive, the CPU 12 interchanges y [1] and the temporary parameter v, and substitutes x (=0) for z [1]. Thereupon, the CPU 12 executes S50. If the result yielded in S47 is negative, the CPU 12 makes a determination in S49 whether or not y [1] is equal to v. If the result yielded in S49 is positive, the operation flow proceeds to S58. If the result yielded in S49 is negative, the operation flow proceeds to S50.

In S50, the CPU 12 makes a determination as to whether or not y [2] is greater than v. If the result yielded in S50 is positive, the operation flow proceeds to S51, wherein the CPU 12 interchanges v and y [2], and substitutes x for z [2]. Thereupon, the CPU 12 executes S53. If the result yielded in S50 is negative, the CPU 12 makes a determination in S52 as to whether or not y [2] is equal to v. If the result yielded in S52 is negative, the operation flow proceeds to S53. If the result yielded in S52 is positive, the operation flow proceeds to S58.

In S53, the CPU 12 makes a determination as to whether or not y [3] is greater than 3. If the result yielded in S53 is positive, the operation flow proceeds to S54, wherein the CPU 12 interchanges v and y [3], and substitutes x for z [3]. Thereupon, the CPU 12 executes S56. If the result yielded in S53 is negative, the CPU 12 makes a determination in S55 as to whether or not y [3] is equal to v. If the result yielded in S55 is negative, the operation flow proceeds to S56. If the result yielded in S55 is positive, the operation flow proceeds to S58.

In S56, the CPU 12 makes a determination as to whether or not y [4] is greater than v. If the result yielded in S56 is positive, the operation flow proceeds to S57, wherein the CPU 12 interchanges v and y [4], and substitutes x for z [4]. Thereupon, the CPU 12 executes S58.

As shown in FIGS. 9B and 11G, a group of five memory blocks are selected and arranged in the ascending order of frequency of erasures. Data is transferred to these five selected memory blocks in preference to the other units. When a unit belonging to the group is found to be erase enabled, the erasure frequency count of that unit is incremented by one.

The second embodiment is configured such that a second group of five memory blocks are selected when the initially selected five memory blocks have the same erasure frequency. An alternative approach is to select a second group of five memory blocks when a predetermined number of memory blocks in the initially selected group are found to have the same erasure frequency.

FIG. 12 is a block diagram showing an example of system to which the above described method for smoothing out erasure frequency is applied. Hereinafter, the construction shown in FIG. 12 is described as a third embodiment. The system shown in FIG. 12 comprises a flash memory IC card 50 and a host computer 54. The flash memory 11 of FIG. 2 corresponds to the flash memory IC card 50 of FIG. 12, and the control unit 14 and the memory 15 of FIG. 2 correspond to the host computer 54 of FIG. 12. The host computer 54 controls the flash memory IC card 50 to execute the process of the first or second embodiment. That is, the feature of the third embodiment is the use of the host computer 54.

The flash memory IC card 50 includes a plurality of flash memory chips 51, an address decoder/chip selector 52 and an address/data bus 53. The flash memory IC card 50 is mounted, for example, in a card insertion slot of the host computer 54, an address/data signal and a control signal being exchanged between the flash memory IC card 50 and the host computer 54. Each of the flash memory chips 51 is segmented into a plurality of memory blocks. The memory blocks may be identified by the aforementioned memory block ID numbers, and the entirety of memory area is subject to management. Alternatively, the flash memory chip 51 may be segmented into several groups so that the memory blocks in a given group are identified by the memory block ID numbers that are managed separately from the ID numbers for the other groups. In this case, the aforementioned process is executed in a group independently of the other groups. In order to access a memory block, a chip select signal is used to select a relevant chip, and the address of a target memory block is output to the chips. Only the selected chip is able to receive the address and has data transferred thereto from the host computer 54.

By applying a simple and time-saving process for smoothing out the erasure frequency to the flash memory IC card 50, it is possible to provide a high-speed external storage medium.

Figure 13:
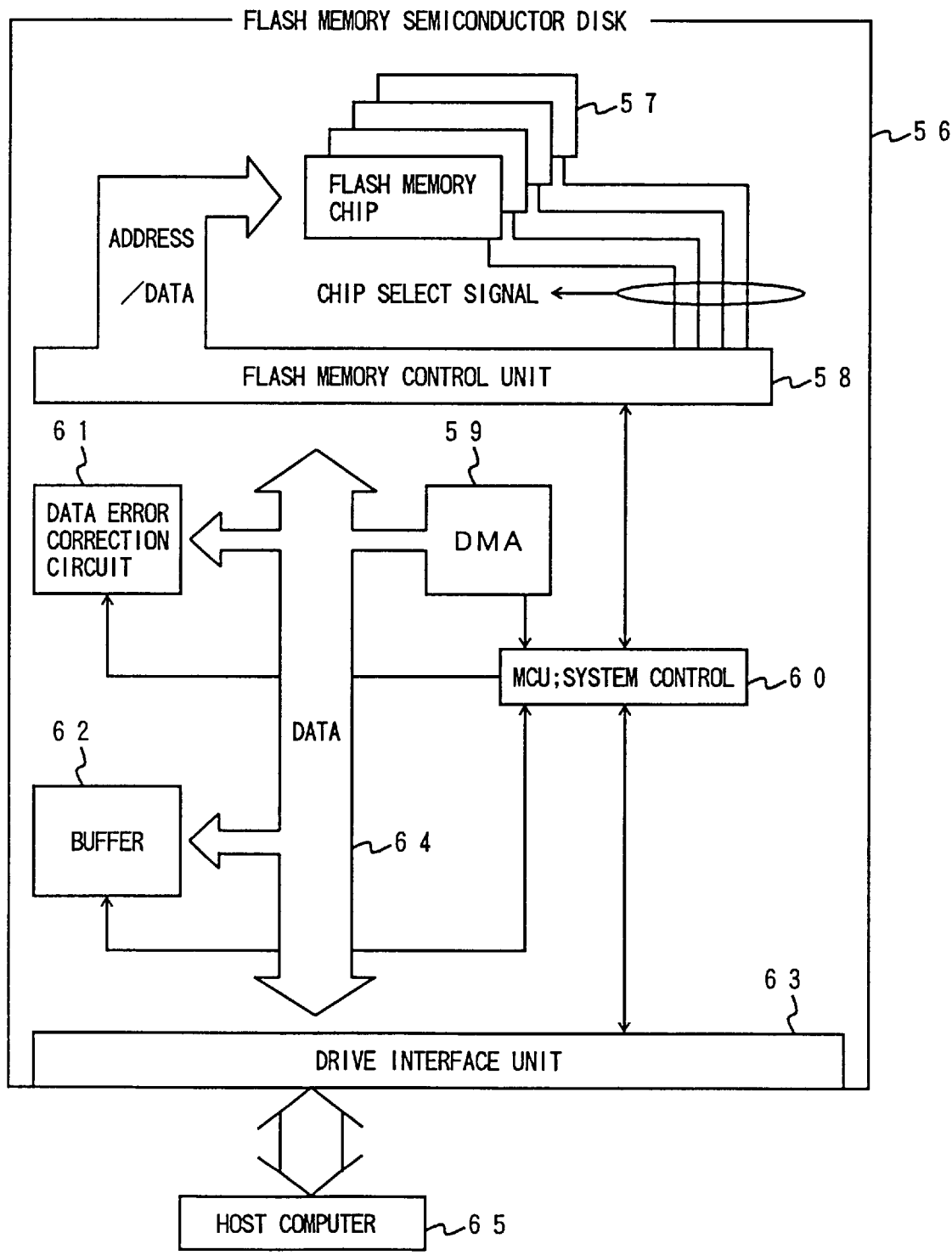
FIG. 13 is a block diagram showing a fourth embodiment of the present invention.

FIG. 13 is a block diagram showing another example of system to which the above described method for smoothing out the erasure frequency is applied. Hereinafter, this construction is described as a fourth embodiment. The system shown in FIG. 13 comprises a flash memory semiconductor disk 56 and a host computer 65. The flash memory 11 and the control unit 14 of t of FIG. 2 correspond to the flash memory semiconductor disk 56 of FIG. 13, and the memory 15 of FIG. 2 corresponds to an internal or external memory of the host computer 56 of FIG. 13. The feature of the fourth embodiment is that the process of the first or second embodiment is executed in the flash memory semiconductor disk 56.

The flash memory semiconductor disk 56 includes a plurality of flash memory chips 57, a flash memory control unit 58, a DMA controller 59, a microcontrol unit (MCU) 60, a data error correction circuit 61, a buffer RAM 62, a drive interface unit 63 and a data bus 64. The MCU 60 functions as a system controller and controls the entirety of the disk 56 to execute processes including the process of the first or second embodiment. The DMA controller 59 corresponds to the data transfer circuit 13 of FIG. 2 and controls data transfer between the flash memory chip 57 and the host computer 65 in response to information relating to data transfer received from the MCU 60. In the data transfer process, transferred data is temporarily stored in the buffer RAM 62. The data error correction circuit 61 performs data error correction in the data transfer operation. Each of the flash memory chips 57 is segmented into a plurality of memory blocks. The memory blocks may be identified by the memory block ID numbers, and the entirety of memory area is subject to management. In order to access a memory block, a chip select signal is used to select a relevant chip, and the address of a target memory block is output to the chips. Only the selected chip is able to receive the address and has data transferred thereto from the host computer 65 under the DMA transfer control.

Figure 14:
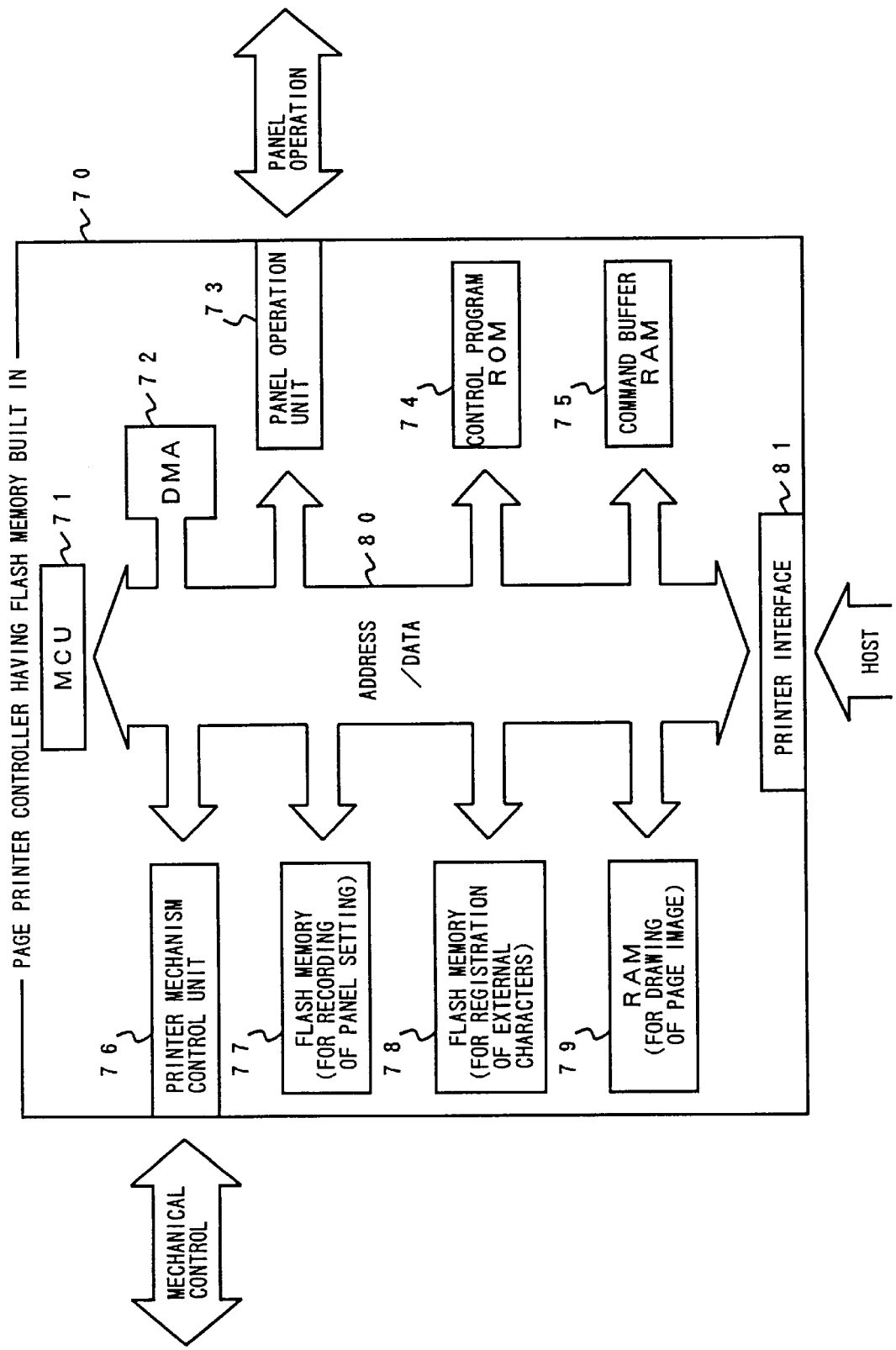
FIG. 14 is a block diagram showing a fifth embodiment of the present invention.

FIG. 14 is a block diagram showing still another example of system to which the method for smoothing out the memory blocks is applied. Hereinafter, this construction will be described as a fifth embodiment of the present invention. FIG. 14 shows a construction of a page printer controller 70 having a flash memory built in. The page printer controller 70 includes all the constituent elements 11, 14 and 15 of the construction of FIG. 2. As shown in FIG. 14, the page printer controller 70 includes an MCU 71, a DMA controller 72, a panel operation unit 73, a control program ROM 74, a command buffer 75, a printer mechanism control unit 76, a flash memory 77, a flash memory 78, a RAM 79, an address/data bus 80 and a printer interface 81. The page printer controller 70 is connected to a host computer (not shown) via the printer interface 81. The MCU 71 controls the entirety of the operation of the page printer controller 70 to execute processes including the process of the first or second embodiment. The DMA controller 72 controls data transfer between the RAM 79 and the flash memory 77 or 78. The panel operation unit 73 serves as an interface between the page printer controller 70 and a panel provided in a printer (not shown). The printer mechanism control unit 76 serves as an interface between the printer controller 70 and a printer mechanism (not shown). For example, the printer mechanism control unit 76 sends a control signal to a printer engine. The control program ROM 74 stores programs necessary for the operation of the MCU 71. The command buffer RAM 75 temporarily stores commands used in the page printer controller 70. The RAM 79 stores graphics data for one page. The flash memory 77 stores data relating to panel setting. The flash memory 78 is used to register external character patterns.

Each of the flash memories 77 and 78 is segmented into a plurality of memory blocks. The memory blocks may be identified by the aforementioned memory block ID numbers, and the entirety of memory area is subject to management. Alternatively, the memory blocks in the flash memory 77 may be identified by the memory block ID numbers that are managed separately from those of the memory blocks in the flash memory 78.

An application of the process for smoothing out the erasure frequency is not limited to the system described above in the third through fifth embodiments. The same process may be applied to a system having a different construction as long as it uses a flash memory. Further, the present invention comprises the smoothing out process in a memory (for example, an EEPROM) other than the ordinary flash memory in which memory the frequency of erasures is limited.

The present invention is not limited to the above described embodiments, and variations and modifications may be made without departing from the scope of the present invention.

What is claimed is:

1. A memory control method for controlling a memory in which a frequency of data erasures that can occur in the memory is limited, said method comprising the steps of:

1) managing control information in each of memory blocks constituting the memory, said control information including first information which joins the memory blocks in an ascending order of frequency of data erasures, and second information which joins the memory blocks in a descending order of frequency of data erasures; and 2) determining, on the basis of said control information, a memory block that should be a transfer destination of write data.

2. The memory control method as claimed in claim 1, wherein said control information includes a contexture defined for each of the memory blocks constituting the memory, and wherein each contexture includes:
      first pointer information, as said first information, indicating a contexture associated with a memory block having the frequency of data erasures equal to or one step greater than the frequency data erasures associated with the contexture including said first pointer information; and
      second pointer information, as said second information, indicating a contexture associated with a memory block having the frequency of data erasures equal to or one step lower than the frequency of data erasures associated with the contexture including said second pointer information.

3. The memory control method as claimed in claim 2, wherein said first step comprises a step of managing only write-enabled memory blocks by joining the memory blocks in a chain using said control information.

4. The memory control method as claimed in claim 2, further comprising the step of:

3) joining a memory block that has just been write enabled to the chain of the existing memory blocks according to its frequency of data erasures.

5. The memory control method as claimed in claim 2, further comprising the step of:

3) setting the first and second pointer information associated with the memory block that has just been write enabled, on the basis of the frequency of data erasures of the memory block that has just been write enabled and on the basis of the frequency of data erasures of the other write-enabled memory blocks, such that the memory block that has just been write enabled is built into the chain of the existing write-enabled memory blocks.

6. The memory control method as claimed in claim 1, wherein said first step comprises a step of managing only write-enabled memory blocks by joining the memory blocks in a chain using said control information.

7. The memory control method as claimed in claim 1, further comprising the step of:

3) joining a memory block that has just been write enabled to the chain of the existing memory blocks according to its frequency of data erasures.

8. The memory control method as claimed in claim 1, wherein said second step comprises the step of:
   searching the chain of memory blocks according to said control information, starting with the memory blocks initially specified by said write data as the transfer destination, and transferring said write data to the memory block having the lowest frequency of data erasures.

9. A memory control method for controlling a memory in which a frequency of data erasures that can occur in the memory is limited, said method comprising the steps of:

1) selecting a predetermined number of memory blocks constituting the memory and managing the frequency of data erasures of the selected memory blocks by control information including first information which joins the memory blocks in an ascending order of frequency of data erasures, and second information which joins the memory blocks in a descending order of frequency of data erasures, and 2) determining a memory block that should be a destination of write data such that all or some of the selected memory blocks have the same frequency of data erasures.

10. The memory control method as claimed in claim 9, wherein said first step comprises the step of:
    selecting said predetermined number of different memory blocks when some or all of the selected predetermined number of memory blocks have the same frequency of data erasures through the second step, and
    managing the frequency of data erasures of said selected predetermined number of different memory blocks.

11. The memory control method as claimed in claim 10, wherein said first step comprises the step of selecting a predetermined number of memory blocks having a relatively low frequency of data erasures or a relatively great frequency of data erasures.

12. An apparatus comprising:
    a memory in which a frequency of data erasures is limited;
    first means for managing control information in each of memory blocks constituting the memory, said control information including first information which joins the memory blocks in an ascending order of frequency of data erasures, and second information which joins the memory blocks in a descending order of frequency of data erasures; and
    second means for determining, on the basis of said control information, a memory block that should be a transfer destination of write data.

13. The apparatus as claimed in claim 12, further comprising:
    a memory in which a frequency of data erasures is not limited; and
    data transfer control means for controlling data transfer between said memory and the memory in which the frequency of data erasures is limited.

14. The apparatus as claimed in claim 12, further comprising data transfer control means for controlling data transfer between an externally connected memory in which the frequency of data erasures is not limited and the memory in which the frequency of data erasures is limited.

15. An apparatus for controlling a memory in which a frequency of data erasures is limited, said apparatus comprising:

first means for managing control information in each of memory blocks constituting the memory, said control information including first information which joins the memory blocks in an ascending order of frequency of data erasures, and second information which joins the memory blocks in a descending order of frequency of data erasures; and second means for determining, on the basis of said control information, a memory block that should be a transfer destination of write data.

* * * * *